(12) United States Patent
Hsieh et al.

(10) Patent No.: US 8,828,755 B2
(45) Date of Patent: Sep. 9, 2014

(54) LIGHT-EMITTING ELEMENT PACKAGE AND FABRICATION METHOD THEREOF

(71) Applicant: Advanced Optoelectronic Technology, Inc., Hsinchu Hsien (TW)

(72) Inventors: Min-Tsun Hsieh, Hsinchu (TW); Wen-Liang Tseng, Hsinchu (TW); Lung-Hsin Chen, Hsinchu (TW); Chih-Yung Lin, Hsinchu (TW); Ching-Lien Yeh, Hsinchu (TW); Chi-Wei Liao, Hsinchu (TW)

(73) Assignee: Advanced Optoelectronic Technology, Inc., Hsinchu Hsien (TW)

(*) Notice: Subject to any disclaimer, the term of this patent is extended or adjusted under 35 U.S.C. 154(b) by 0 days.

(21) Appl. No.: 13/973,941

(22) Filed: Aug. 22, 2013

(65) Prior Publication Data

US 2014/0051193 A1 Feb. 20, 2014

Related U.S. Application Data

(62) Division of application No. 13/113,081, filed on May 23, 2011, now Pat. No. 8,541,799.

(30) Foreign Application Priority Data

May 31, 2010 (CN) .......................... 2010 1 0187222

(51) Int. Cl.
*H01L 21/00* (2006.01)
(52) U.S. Cl.
USPC .............................................. 438/27; 438/22

(58) Field of Classification Search
USPC ...................................................... 438/27, 22
See application file for complete search history.

(56) References Cited

U.S. PATENT DOCUMENTS

| 8,026,533 B2 | 9/2011 | Noichi |
| 8,092,735 B2 | 1/2012 | Thompson |
| 2008/0210965 A1 | 9/2008 | Hung |
| 2009/0114937 A1* | 5/2009 | Kawakubo ...................... 257/98 |
| 2010/0314785 A1 | 12/2010 | Usami |
| 2011/0049548 A1* | 3/2011 | Park et al. ...................... 257/98 |

FOREIGN PATENT DOCUMENTS

| TW | 200818539 A | 4/2008 |
| TW | 200818554 A | 4/2008 |
| TW | 200921949 A | 5/2009 |
| TW | 200946319 A | 11/2009 |

* cited by examiner

*Primary Examiner* — Douglas Menz
(74) *Attorney, Agent, or Firm* — Novak Druce Connolly Bove + Quigg LLP

(57) ABSTRACT

A fabrication method for a light-emitting element package, the method comprising: providing a high precision wafer level mold module, the high precision wafer level mold module comprising an upper mold and a bottom mold; mounting a substrate with a plurality of light-emitting elements between the upper mold and the bottom mold; filling package materials into the high precision wafer level mold module to obtain package members mounted on the light-emitting elements; and removing the high precision wafer level mold module.

9 Claims, 9 Drawing Sheets

LIGHT-EMITTING ELEMENT PACKAGE AND FABRICATION METHOD THEREOF

CROSS-REFERENCE TO RELATED APPLICATIONS

This patent application is a divisional application of patent application Ser. No. 13/113,081, filed on May 23, 2011, entitled "LIGHT-EMITTING ELEMENT PACKAGE AND FABRICATION METHOD THEREOF," which is assigned to the same assignee as the present application, and which is based on and claims priority from Chinese Patent Application No. 201010187222.0 filed in China on May 31, 2010. The disclosures of patent application Ser. No. 13/113,081 and the Chinese Patent Application are incorporated herein by reference in their entirety.

BACKGROUND

1. Technical Field

The disclosure relates generally to semiconductor packages, and more particularly to a light-emitting element package and fabrication method for the package.

2. Description of the Related Art

Frequently, photonic crystal patterns are formed on LED packaging by nano-imprint lithography. However, precision of the nano-imprint lithography process is limited, such that illumination efficiency of the LED is impaired. Therefore, there is a need for improvement in the art.

BRIEF DESCRIPTION OF THE DRAWINGS

Many aspects of the embodiments can be better understood with references to the following drawings. The components in the drawings are not necessary drawn to scale, the emphasis instead being placed upon clear illustrating the principles of the embodiments. Moreover, in the drawings, like reference numerals designate corresponding parts throughout two views.

DETAILED DESCRIPTION

Figure 1:
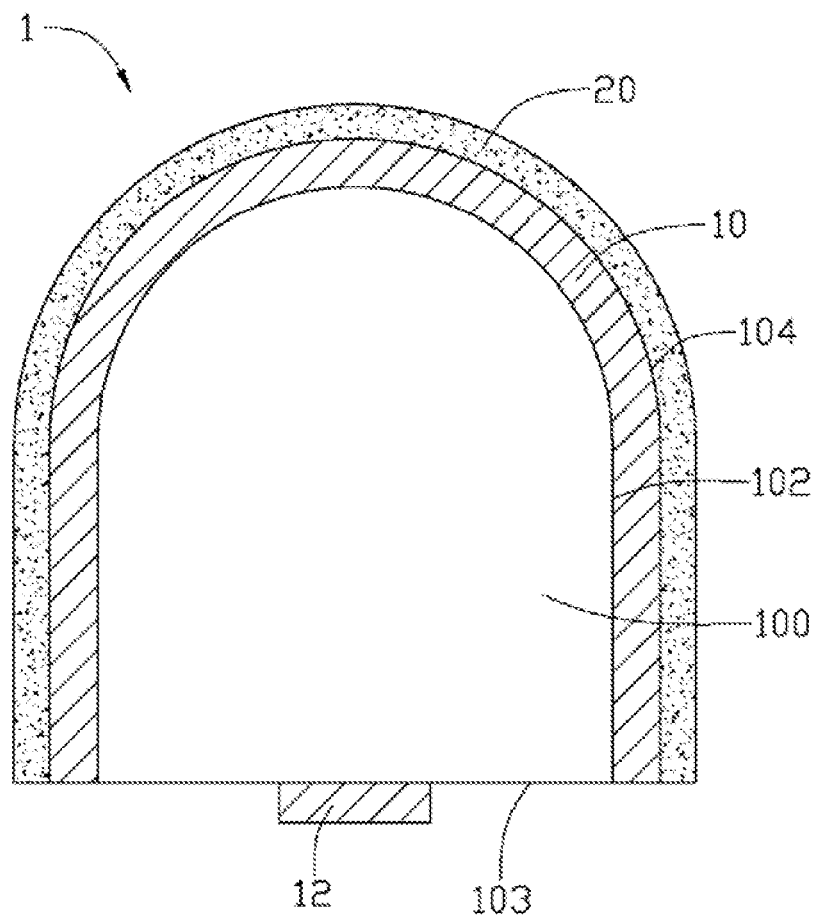
FIGS. 1-4 are cross-sections of a light-emitting element package in accordance with one embodiment of the disclosure.
Figure 2:
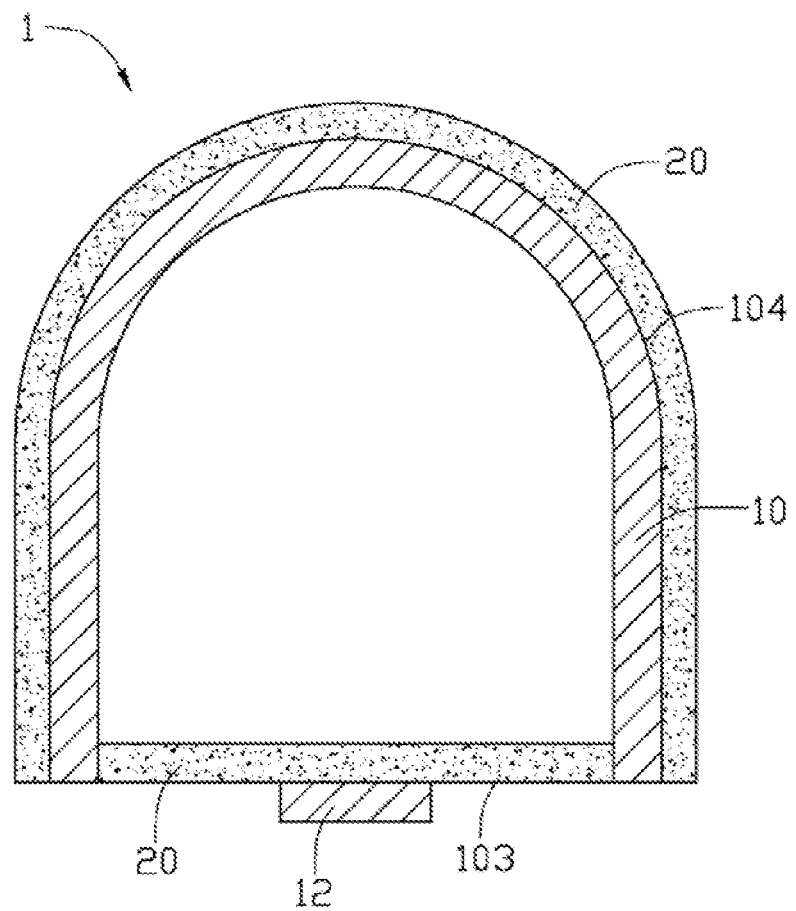
Figure 3:
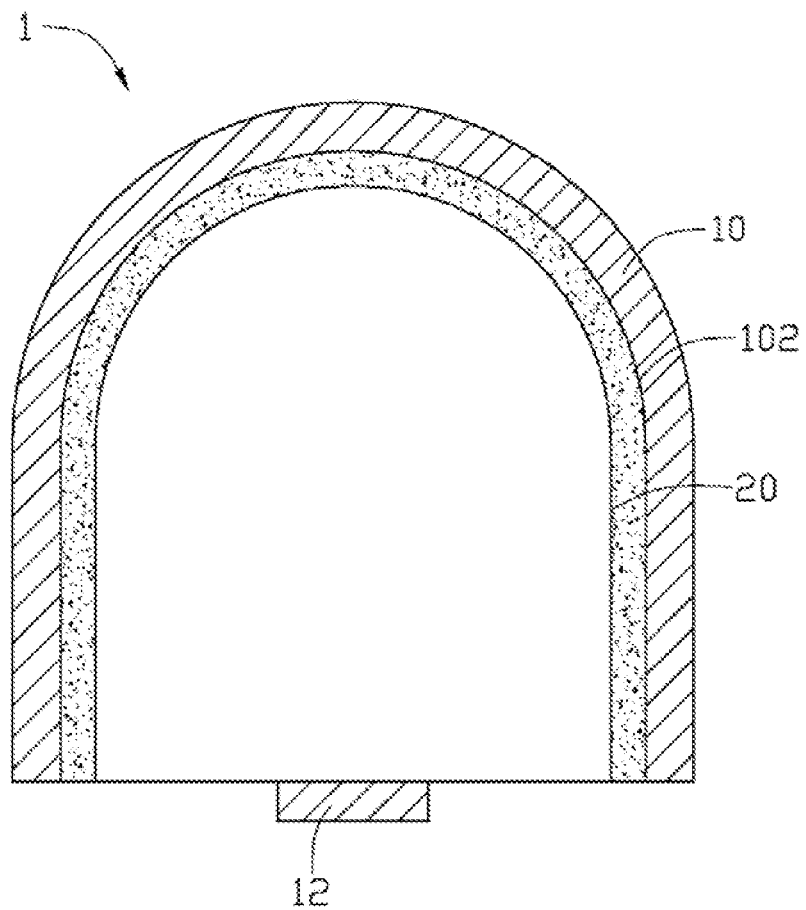
Figure 4:
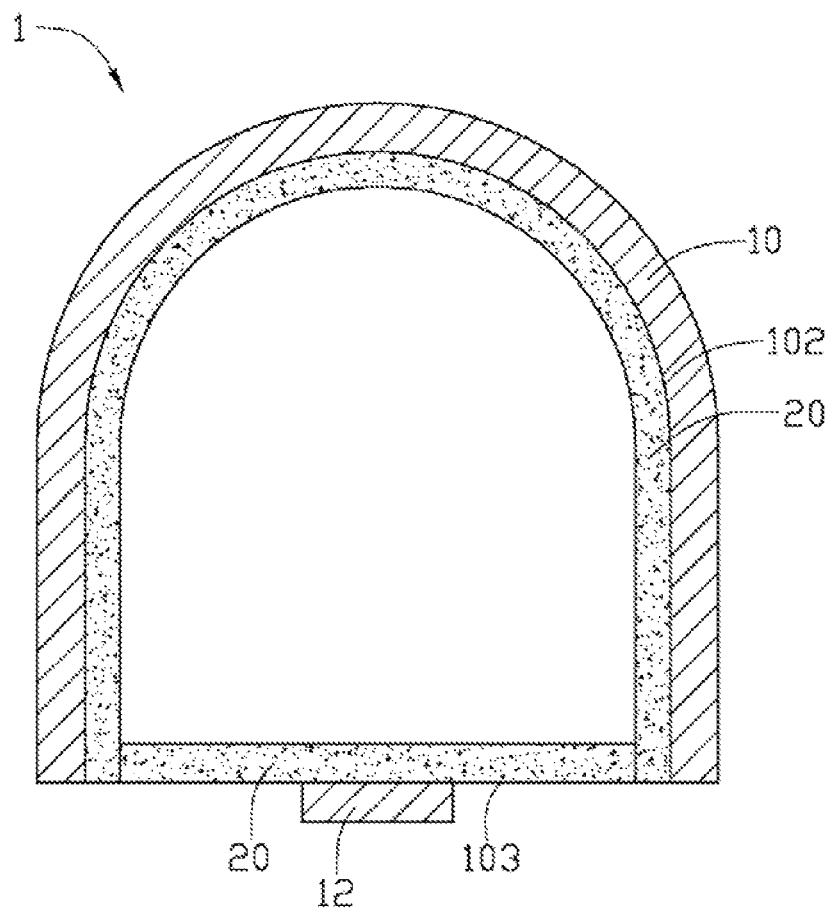
Figure 5:
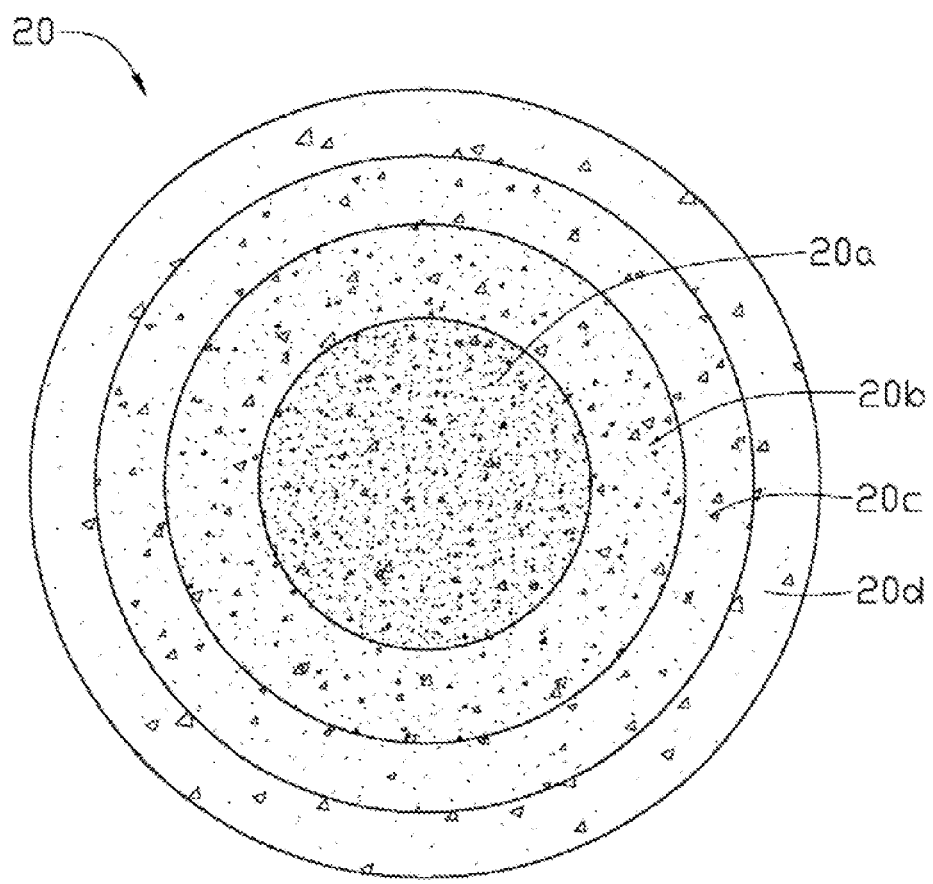
FIG. 5 is a top view of the light-emitting element package in FIG. 1.

The disclosure is illustrated by way of example and not by way of limitation in the figures of the accompanying drawings. It should be noted that references to "an" or "one" embodiment in this disclosure are not necessary to the same embodiment, and such references mean at least one.

Referring to FIGS. 1-5, a light-emitting element package 1 in accordance with one embodiment of the disclosure includes a package member 10 and a light-emitting element 12. The package member 10 is configured for encapsulating the light-emitting element 12. In the embodiment, the package member 10 is a lens. A receiving portion 100 is defined in the package member 10. The package member 10 includes an interior surface 102, an exterior surface 104 and a light incident surface 103. The light incident surface 103 is located at the bottom of the package member 10 and configured for receiving light from the light-emitting element 12.

A plurality of photonic crystal patterns 20 can be formed on the exterior surface 104, interior surface 102 or the light incident surface 103. The photonic crystal patterns 20 also can be formed on some or all of the surfaces 102, 103, 104 of the package member 10.

Each of the photonic crystal patterns 20 is consisted of photonic crystals. The photonic crystal is composed of periodic dielectric or metallo-dielectric nanostructures that affect the propagation of electromagnetic waves (EM) in the same way as the periodic potential in a semiconductor crystal affects the electron motion by defining allowed and forbidden electronic energy bands.

The diameter of each of the photonic crystals is about 1000 μm. In the embodiment, the diameter of the photonic crystal is a half of visible light wavelength or under 350 μm.

The distribution density of the photonic crystal patterns of the package member 10 can be a gradient distribution or corresponding to the light distribution of the light-emitting element 12. In the embodiment, the distribution density of the photonic crystal patterns 20a in the center of the package member 10 exceeds that of photonic crystal patterns 20b, 20c, 20d in other areas.

The distribution density of photonic crystal patterns 20a, 20b, 20c, 20d decreases in turn to form a gradient distribution.

The photonic crystal patterns 20 can be formed by a high precision wafer level mold module 30. The photonic crystal patterns 20 can be formed as a film to be coated on the interior surface 102, exterior surface 104 or light incident surface 103 of the package member 10.

Figure 6:
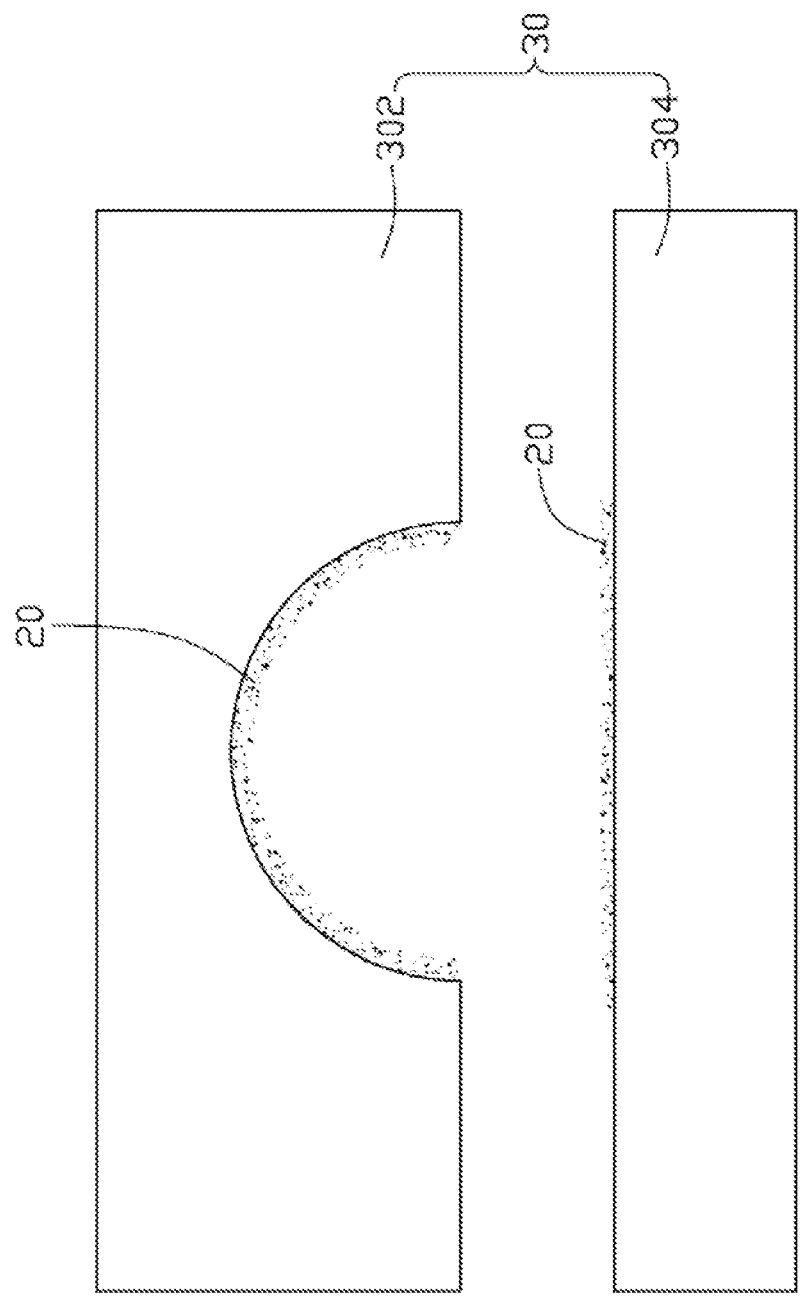
FIG. 6 is a schematic view of a fabrication method for a light-emitting element package in accordance with a first embodiment of the disclosure.

Referring to FIG. 6, a fabrication method for light-emitting element package 1 in accordance with a first embodiment of the disclosure is as follows.

First, a high precision wafer level mold module 30 is provided, including an upper mold 302 and a bottom mold 304.

Second, a plurality of photonic crystal patterns 20 is formed on the upper mold 302 and the bottom mold 304.

Third, package materials are filled in the wafer level mold module 30 to obtain the package member 10 (FIG. 1). Thus, the package member 10 is formed with photonic crystal patterns 20. The photonic crystal patterns 20 can be formed on the exterior surface 102 or light incident surface 103 of the package member 10.

The package material can include phosphor elements or light diffusion agents. The phosphor elements can be YAG, TAG, silicate, nitride, nitrogen oxide, phosphide, sulfide or a combination thereof.

The light diffusion agent can be $SiO_2$ series light diffusion agent, $TiO_2$ series light diffusion agent or $CaCO_3$ series light diffusion agent. The light diffusion agent is configured for increasing diffusing and transmitting of the light from light-emitting element 12 to increase the illumination efficiency of the light-emitting element package 1.

Finally, the package member 10 is mounted on the light-emitting element 12.

The photonic crystal patterns 20 of the high precision wafer level mold module 30 can be formed by electroforming or high intensity beam.

Figure 7:
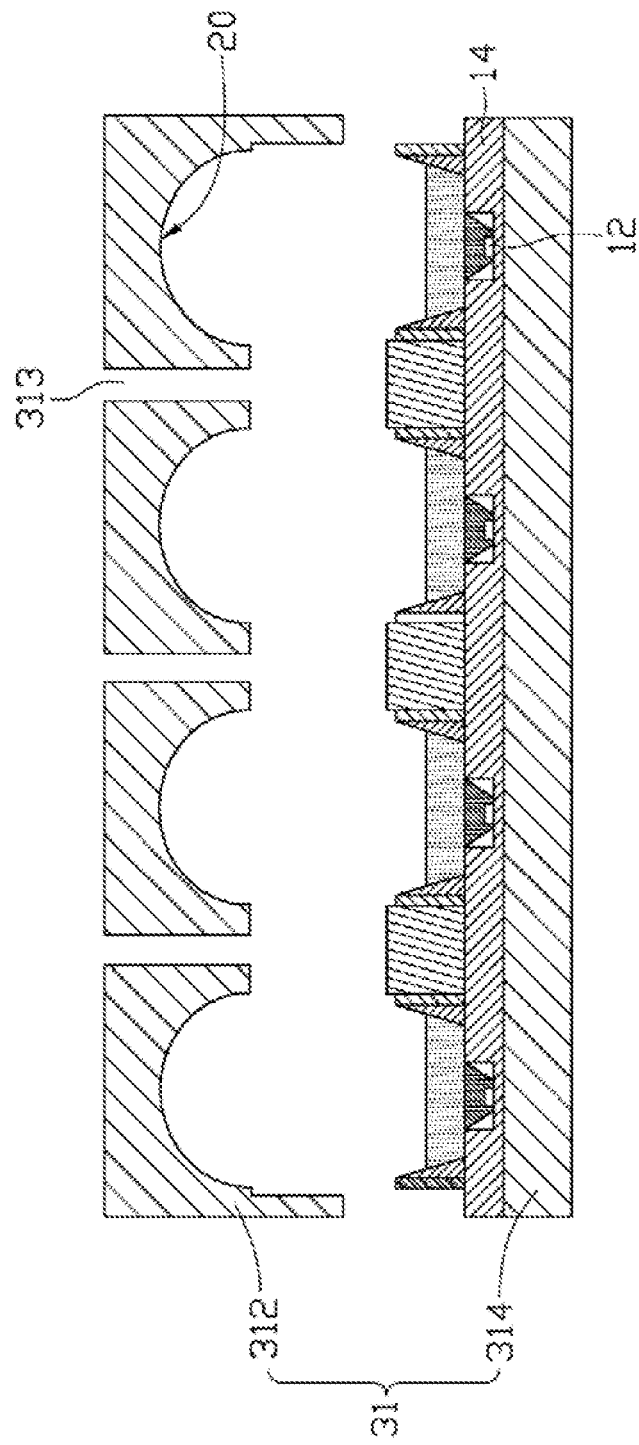
FIGS. 7-9 are schematic views of a fabrication method for a light-emitting element package in accordance with a second embodiment of the disclosure.
Figure 8:
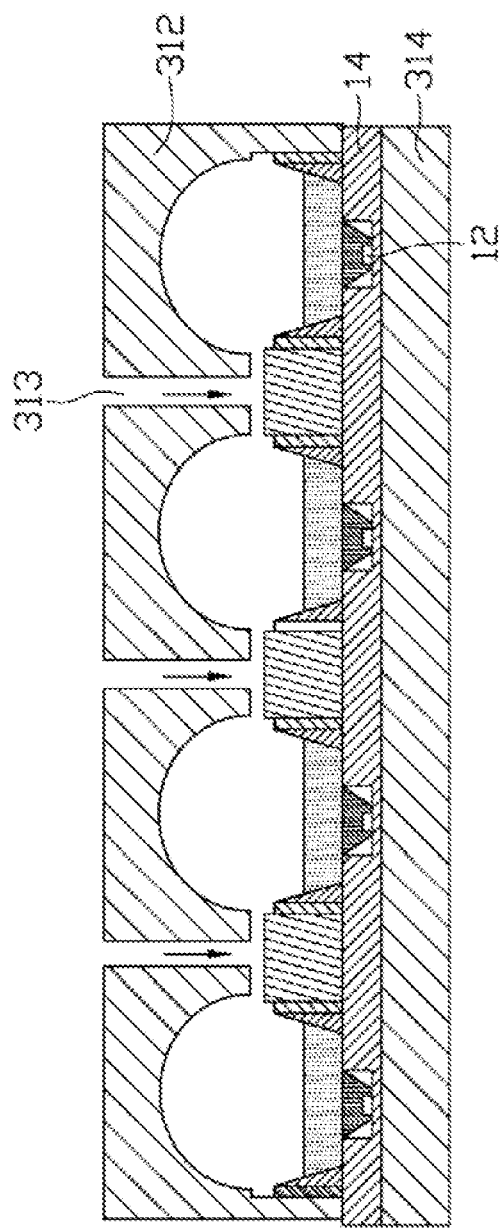
Figure 9:
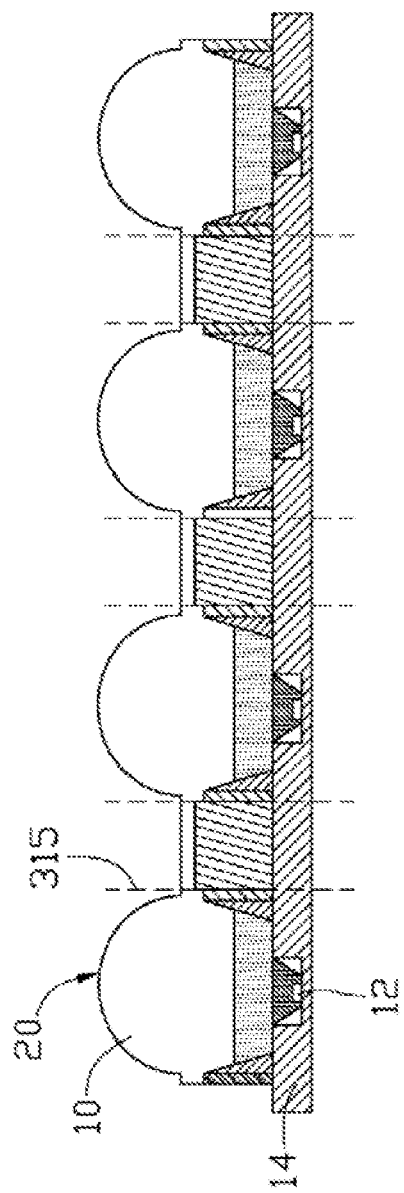

Referring to FIGS. 7-9, a fabrication method for light-emitting element package 1 in accordance with a second embodiment of the disclosure is as follows.

First, a plurality of light-emitting elements 12 (FIG. 9) is mounted on a substrate 14.

Second, a wafer level mold module 31 is provided. The wafer level mold module 31 includes a plurality of upper molds 312 and a bottom mold 314. A plurality of recesses 313 is defined between the upper molds 312. A plurality of photonic crystal patterns 20 is formed on interior surfaces of the upper molds 312.

Third, the substrate 14 is mounted between the upper molds 312 and the bottom mold 314. The melted package materials are filled in the upper molds 312 through the recesses 313 to obtain the package members 10 (FIG. 9). The melted package materials are glass, silicon, polycarbonate (PC) or polymethyl methacrylate (PMMA).

Fourth, the upper molds 312 and the bottom mold 314 are separated to obtain a semi-finished product as shown in FIG. 9.

Final, a plurality of light-emitting element packages is obtained by dicing the semi-finished product along lines 315 by laser or water jet.

Thus, illumination efficiency of the light-emitting element package 1 is optimized according to the photonic crystal patterns 20 of the package member 10.

While the disclosure has been described by way of example and in terms of exemplary embodiment, it is to be understood that the disclosure is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A fabrication method for a light-emitting element package, the method comprising:
    providing a high precision wafer level mold module, the high precision wafer level mold module comprising an upper mold and a bottom mold;
    mounting a substrate with a plurality of light-emitting elements between the upper mold and the bottom mold;
    filling package materials into the high precision wafer level mold module to obtain package members mounted on the light-emitting elements, the package members each being formed with a plurality of photonic crystal patterns each of which consists of a plurality of photonic crystals, a distribution density of the photonic crystal patterns being corresponding to light distribution of a corresponding light-emitting element; and
    removing the high precision wafer level mold module.

2. The fabrication method for a light-emitting element package of claim 1, wherein a distribution density of the photonic crystal patterns is a gradient distribution.

3. The fabrication method for a light-emitting element package of claim 1, wherein a plurality of photonic crystal patterns each of which consists of a plurality of photonic crystals is formed on the upper mold and the bottom mold of the high precision wafer level mold module, the plurality of photonic crystal patterns formed on the upper mold and the bottom mold being provided for forming the plurality of photonic crystal patterns on the package members.

4. The fabrication method for a light-emitting element package of claim 3, wherein the photonic crystals on the upper mold and the bottom mold of the high precision wafer level mode are formed by electroforming process or high intensity beam process.

5. The fabrication method for a light-emitting element package of claim 1, wherein the package materials are glass, silicon, PC or PMMA.

6. The fabrication method for a light-emitting element package of claim 1, wherein the package materials comprise phosphor elements.

7. The fabrication method for a light-emitting element package of claim 1, wherein the package members comprise optical diffusing agents.

8. The fabrication method for a light-emitting element package of claim 1, wherein the distribution density of the photonic crystal patterns in a center of a corresponding package member exceeds that of photonic crystal patterns in other areas thereof.

9. The fabrication method for a light-emitting element package of claim 2, wherein the distribution density of the photonic crystal patterns gradually decreases from a central portion of a corresponding package member to a peripheral portion of the corresponding package member.

* * * * *